(12) United States Patent
Duqi et al.

(10) Patent No.: US 10,392,245 B2
(45) Date of Patent: Aug. 27, 2019

(54) SEMICONDUCTOR INTEGRATED DEVICE WITH ELECTRICAL CONTACTS BETWEEN STACKED DIES AND CORRESPONDING MANUFACTURING PROCESS

(71) Applicant: STMICROELECTRONICS S.R.L., Agrate Brianza (IT)

(72) Inventors: Enri Duqi, Milan (IT); Lorenzo Baldo, Bareggio (IT); Domenico Giusti, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/591,652

(22) Filed: May 10, 2017

(65) Prior Publication Data
US 2018/0148325 A1 May 31, 2018

(30) Foreign Application Priority Data

Nov. 29, 2016 (IT) .......................... 102016000121003

(51) Int. Cl.
*B81C 1/00* (2006.01)
*B81B 7/00* (2006.01)

(52) U.S. Cl.
CPC .......... *B81C 1/00238* (2013.01); *B81B 7/007* (2013.01); *B81B 7/0051* (2013.01); *B81B 2201/0235* (2013.01); *B81B 2201/0242* (2013.01); *B81B 2201/0264* (2013.01); *B81B 2203/0118* (2013.01); *B81B 2203/0127* (2013.01); *B81B 2203/0315* (2013.01); *B81B 2207/012* (2013.01); *B81B 2207/07* (2013.01); *B81C 2201/0133* (2013.01); *B81C 2203/032* (2013.01); *B81C 2203/035* (2013.01); *B81C 2203/0792* (2013.01)

(58) Field of Classification Search
CPC ... B81B 7/007; B81B 7/0051; B81B 2207/07; B81B 2207/012; B81B 2203/0127; B81B 2203/0118; B81B 2201/0264; B81B 2201/0242; B81B 2201/0235; B81B 2203/0315; B81C 1/00238; B81C 2203/0792; B81C 2201/0133; B81C 2203/035; B81C 2203/032
USPC ........................................................ 257/415
See application file for complete search history.

(56) References Cited

U.S. PATENT DOCUMENTS 6,285,081 B1 9/2001 Jackson
6,743,664 B2 * 6/2004 Liang .................. H01L 23/5387
257/E23.177

(Continued)

*Primary Examiner* — Hrayr A Sayadian
(74) *Attorney, Agent, or Firm* — Seed IP Law Group LLP

(57) ABSTRACT

An integrated device includes: a first die; a second die coupled in a stacked way on the first die along a vertical axis; a coupling region arranged between facing surfaces of the first die and of the second die, which face one another along the vertical axis and lie in a horizontal plane orthogonal to the vertical axis, for mechanical coupling of the first and second dies; electrical-contact elements carried by the facing surfaces of the first and second dies, aligned in pairs along the vertical axis; and conductive regions arranged between the pairs of electrical-contact elements carried by the facing surfaces of the first and second dies, for their electrical coupling. Supporting elements are arranged at the facing surface of at least one of the first and second dies and elastically support respective electrical-contact elements.

22 Claims, 7 Drawing Sheets

(56) References Cited

U.S. PATENT DOCUMENTS

| | | | |
|---|---|---|---|
| 8,173,513 B2 | 5/2012 | Villa et al. | |
| 9,688,531 B2 | 6/2017 | Baldo et al. | |
| 2003/0222337 A1* | 12/2003 | Stewart | B81C 1/00238 |
| | | | 257/684 |
| 2006/0249857 A1* | 11/2006 | Haba | G01R 1/0483 |
| | | | 257/787 |
| 2015/0115376 A1* | 4/2015 | Chen | B81B 3/0094 |
| | | | 257/415 |

* cited by examiner

SEMICONDUCTOR INTEGRATED DEVICE WITH ELECTRICAL CONTACTS BETWEEN STACKED DIES AND CORRESPONDING MANUFACTURING PROCESS

BACKGROUND

Technical Field

The present disclosure relates to a semiconductor integrated device with electrical contacts between stacked dies and to a corresponding manufacturing process.

Description of the Related Art

As is known, in the field of manufacturing of integrated devices the need frequently arises to couple together, from a mechanical and electrical standpoint, dies of semiconductor material, for example including silicon, obtained from dicing of respective wafers.

In particular, sensor devices are known, including micromechanical sensing structures made, at least in part, of semiconductor materials and using MEMS (Micro-Electro-Mechanical Systems) technology. These sensor devices are used in portable electronic apparatuses, such as portable computers, laptops or ultrabooks, PDAs, tablets, cellphones, smartphones, digital audio players, photographic cameras or video cameras, and consoles for videogames, allowing to achieve important advantages as regards space occupation, in terms of area and thickness.

A MEMS sensor device generally comprises: a micromechanical sensing structure, designed to transduce a mechanical quantity to be detected (for example, a pressure, an acceleration, or an angular velocity) into an electrical quantity (for example, a capacitive variation); and an electronic circuit, usually provided as an ASIC (Application-Specific Integrated Circuit), designed to carry out appropriate processing operations (amongst which amplification and filtering operations) of this electrical quantity so as to supply an electrical output signal, whether analog (for example, a voltage), or digital (for example, a PDM—Pulse-Density Modulation—signal). This electrical signal, possibly further processed by an electronic interface circuit, is then made available to an external electronic system, for example a microprocessor control circuit of an electronic apparatus incorporating the sensor device.

The process for manufacturing a MEMS sensor device thus in general envisages providing the micromechanical sensing structure in a first wafer and the ASIC in a second wafer, and then coupling together the first and second wafers, from the mechanical and electrical standpoint (so as to guarantee transfer of electrical signals between the same wafers). Next, the wafers are diced for definition of the stacked dies (alternatively, dicing of the wafers may be performed prior to coupling thereof).

A known technique envisages, for the above coupling operation, use of metal bonding between the two wafers (or dies) of semiconductor material, by means of regions of metal material, for example copper, gold, or aluminum, which are formed on the faces of the two wafers, which are aligned and then made to adhere, for instance by thermocompression bonding, so as to give rise to the desired coupling.

Circuit elements of the ASIC and contact pads of the micromechanical sensing structure are electrically connected to these metal regions, so that bonding between the two wafers not only determines mechanical coupling, but also electrical coupling between the ASIC and the micromechanical sensing structure.

The above coupling technique, although advantageous, may prove difficult and costly to implement, for example as a result of the difficulty of alignment and coupling of the metal regions formed on the surfaces of the wafers. Due to coupling defects between the metal regions, problems and defectiveness may arise in the electrical connection between the circuits and/or the micromechanical structures in the coupled wafers.

In the case where use of the metal-bonding technique is thus not advisable, a different solution may envisage mechanical coupling of the wafers by bonding techniques using non-conductive material, for example glass frit, and formation, in a distinct and separate way, of the electrical connections by electrical contacts of an ohmic type (for example, via soldering between contact elements carried by the coupled faces of the wafers).

Even though the above solution is certainly less costly and in general has a lower complexity, it is not, however, free from problems.

BRIEF SUMMARY

The present Applicant has realized that the bonding region may have a non-uniformity of thickness between the coupled surfaces of the wafers, with consequent non-uniformities of the gap that is formed between the surfaces of the coupled wafers (for example, this gap may vary in a range comprised between 5 and 10 µm). In addition, the same wafers may have non-uniformities of thickness, for example of a value comprised between 1 and 4 µm. These non-uniformities may jeopardize proper electrical contact between the contact elements provided on the coupled surfaces, for electrical contact between the circuits and/or the micromechanical structures in the wafers.

At least one embodiment of the present disclosure solves, at least in part, the problems highlighted previously and provides a solution for mechanical and electrical coupling between wafers of semiconductor material, that will be simpler to realize and at the same time will have a high reliability.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

As will be discussed in detail hereinafter, an aspect of the present solution in general envisages providing, on the coupling surface of at least one of the two wafers (or dies) to be coupled, electrical-contact elements having characteristics of flexibility so as to adapt to the possible variations of thickness of the bonding region and to the corresponding variations of the gap between the facing surfaces of the coupled wafers.

Figure 1:
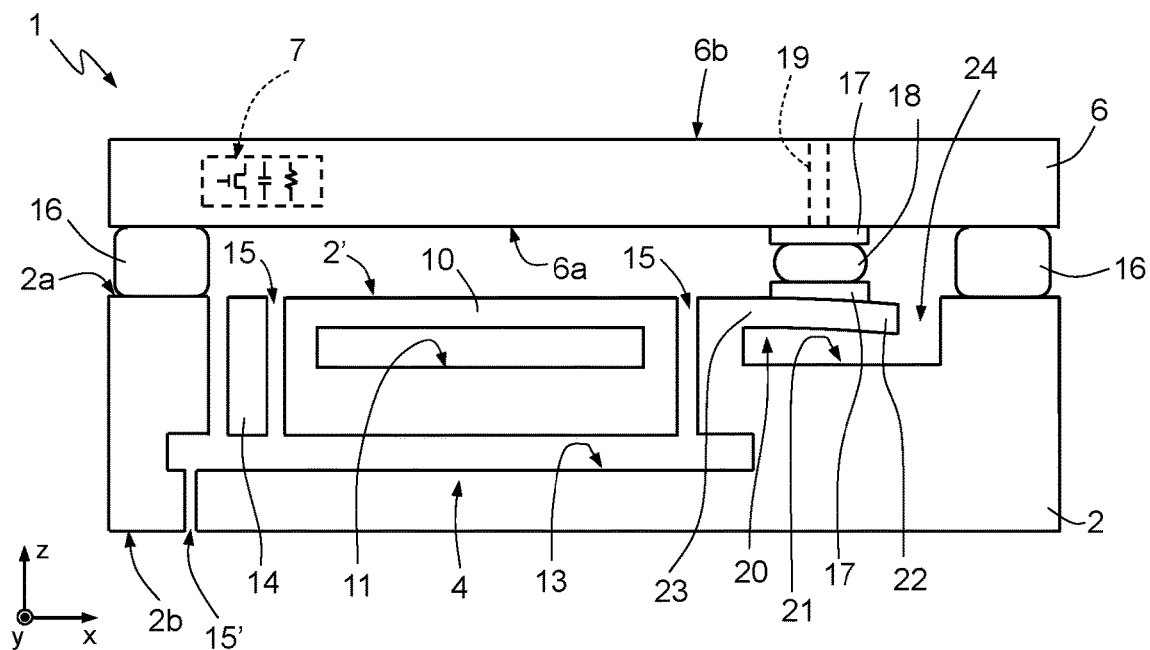
FIG. 1 shows a schematic cross-sectional view of an integrated device with coupled dies, according to one embodiment of the present solution.

In detail, FIG. 1 shows an integrated device, designated as a whole by 1, according to the present solution. In particular, the integrated device 1 is a sensor device, in the example a pressure sensor, namely, a sensor designed to detect pressure waves coming from the external environment and to generate a corresponding electrical detection signal.

The integrated device 1 comprises: a first die (or, in general, body) 2 including semiconductor material, in which a micromechanical sensing structure 4 is, for example, provided; and a second die 6 including semiconductor material, in which an ASIC 7 (illustrated schematically in FIG. 1) is, for example, provided.

In particular, the first die 2 has a first surface 2a, extending in a horizontal plane xy and designed for coupling to the second die 6, and a second surface 2b, which is opposite to the first surface 2a along a vertical axis z, orthogonal to the aforesaid horizontal plane xy, and is designed for contacting the external environment.

The micromechanical sensing structure 4 comprises a membrane 10, provided at the first surface 2a in an active portion 2' of the first die 2, and suspended above a first sensor cavity 11, buried within the first die 2 (as will be described in detail hereinafter).

The aforesaid active portion 2' of the first die 2 is further arranged suspended above a second sensor cavity 13, underlying the first sensor cavity 11 (which is consequently arranged between the second sensor cavity 13 and the membrane 10 along the vertical axis z), and is elastically connected to a bulk portion of the first die 2 by an elastic suspension element 14.

In particular, the active portion 2' (and, consequently, the membrane 10) is externally surrounded by a trench 15, which extends from the first surface 2a of the first die 2 as far as the second sensor cavity 13.

For instance, in the embodiment shown, the trench 15 has a square-spiral shape. In this way, as shown in the top plan view of FIG. 2, the trench 15 is constituted by five sides that delimit the active portion 2' of the first die 2, and also the elastic suspension element 14 (which has in this case a linear, arm-shaped, conformation and connects the active portion 2' to the bulk portion of the first die 2).

The second sensor cavity 13 is in fluidic communication with the external environment at the second face 2b of the first die, by an access channel 15', which extends from the aforesaid second face 2b as far as the second sensor cavity 13, along the vertical axis z.

The second die 6 has a respective first surface 6a, extending in the horizontal plane xy and designed for coupling to the first die 2, and a second surface 6b, opposite to the first surface 6a along the vertical axis z.

The ASIC 7 is obtained, in a per se known manner, not discussed in detail herein, in a surface portion of the second die 6, at the first surface 6a thereof.

Figure 2:
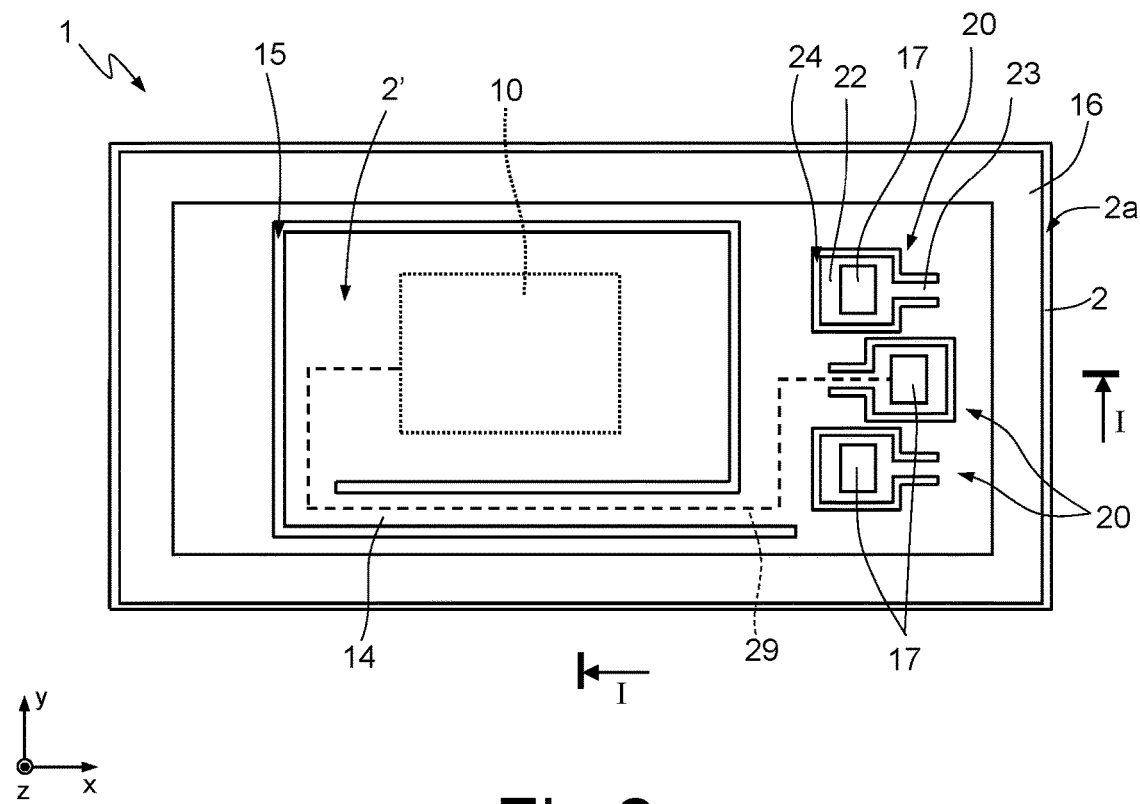
FIG. 2 is a schematic top plan view of the integrated device of FIG. 1.

The integrated device 1 further comprises a coupling region 16, which is arranged between the first surface 2a of the first die and the respective first surface 6a of the second die 6 and has a ring conformation, in the example of a substantially square ring (as shown in FIG. 2).

In particular, the coupling region 16 is made of an electrically non-conductive material, in this embodiment including a glass-frit and which may consequently be defined as "dummy", this region externally surrounding the active portion 2' of the first die 2 and the trench 15.

In a per-se known manner, coupling of the first and second dies 2, 6 by the coupling region 16 envisages: formation and definition of the glass frit over one, or both, of the first surfaces 2a, 6a of the first and second dies 2, 6, with the desired conformation; and then stacking of the first and second dies 2, 6 and application of a thermocompression between the same bodies, for example with values of the order of 10 kN at a high temperature, for example comprised between 300° C. and 400° C., so as to define the coupling region 16.

Advantageously, and as described in detail in the U.S. patent application Ser. No. 15/191,160 filed on Jun. 23, 2016 in the name of the present Applicant, during the coupling step of the first and second dies 2, 6, the suspended arrangement and the elastic coupling of the active portion 2' with respect to the bulk portion of the first die 2 allow to elastically decouple the same active portion 2' (and the corresponding membrane 10), which is thus not affected by stresses or deformations that could modify the mechanical and electrical characteristics thereof (generating, for example, an offset of the value of the electrical output quantity at rest, i.e., in the absence of a pressure acting upon the membrane 10).

The integrated device 1 further comprises a plurality of contact pads 17, of conductive material, for example tin, gold, or copper, carried by the respective first surfaces 2a, 6a of the first and second dies 2, 6, aligned in pairs along the vertical axis z and connected mechanically and electrically by conductive regions 18, for instance constituted by solder paste, which is made, for example, of gold and tin alloys.

The contact pads 17 are arranged internally with respect to the coupling region 16. In particular, the contact pads 17 carried by the first surface 2a of the first die 2 are arranged between the coupling region 16 and the active portion 2' of the first die 2.

Moreover, the integrated device 1 comprises, in this embodiment, through vias 19, including conductive material, which traverse the second die 6 throughout its thickness along the vertical axis z, from the contact pads 17 provided on the respective first surface 6a as far as the second surface 6b, where, in a per se known manner, electrical-contact elements (not illustrated herein) may be provided, such as conductive lands or bumps, designed for example for electrical coupling with a PCB (Printed Circuit Board) of an electronic apparatus incorporating the integrated device 1.

Consequently, the integrated device 1 has, in this embodiment, a so-called "wafer-level" package, i.e., a package provided by the same dies of semiconductor material where the ASIC 7 and the micromechanical sensing structure 4 are integrated.

As will be discussed in detail hereinafter, the process for manufacturing the integrated device 1 thus envisages formation of the contact pads 17 on the first surfaces 2a, 6a of the first and second dies 2, 6 and then coupling in pairs of the contact pads 17 via formation of the conductive regions 18 by a thermal-bonding process. Advantageously, this thermal process may be performed at a same time with the mechanical coupling of the first and second dies 2, 6 by the coupling region 16, exploiting the thermocompression process.

According to a particular aspect of the present solution, the integrated device 1 further comprises a plurality of supporting elements 20, having characteristics of flexibility, in particular being able to undergo deformation along the vertical axis z, each of which is designed to support a respective one of the contact pads 17 carried by the first surface 2a of the first die 2.

Each supporting element 20 is suspended in cantilever fashion above a respective suspension cavity 21, provided in the bulk portion of the first die 2, at the first surface 2a, laterally with respect to, and at a distance from, the membrane 10 of the micromechanical sensing structure 4.

In detail, each supporting element 20 comprises a base 22, having, for example, a substantially square shape in the horizontal plane xy, on which the respective contact pad 17 is provided, and a flexible arm 23 that connects the base 22 to the bulk portion of the first die 2, so that the base 22 is suspended in cantilever fashion above the suspension cavity 21. A suspension trench 24 surrounds the base 22 and the respective flexible arm 23, and extends from the first surface 2a of the first die 2 as far as the suspension cavity 21.

As shown in FIG. 2, the supporting elements 20 may be arranged in a way substantially aligned along a first horizontal axis y of the horizontal plane xy, having in pairs the flexible arms 23 arranged on opposite sides with respect to a second horizontal axis x of the horizontal plane xy, thus achieving an effective area occupation.

Advantageously, and as illustrated schematically in the aforesaid FIG. 1, upon coupling between the first and second dies 2, 6 and electrical contact between the contact pads 17 carried by the corresponding first surfaces 2a, 6a, the supporting elements 20 may undergo elastic deformation in the direction of the vertical axis z so as to adapt to the possible variability of thickness of the coupling region 16 and/or to non-uniformities of thickness of the same dies 3, 6, or of layers of material provided on the corresponding first surfaces 2a, 6a, or again to corresponding warping or deformation.

In particular, the flexible arms 23 may undergo deformation along the vertical axis z so that the base 22 approaches a bottom (or base) surface of the respective suspension cavity 21.

Electrical-contact paths 29 contact the contact pads 17 carried by the supporting elements 20 and the micromechanical sensing structure 4, in particular the corresponding membrane 10 and possible electronic components provided in the same membrane 10 (as discussed hereinafter). As shown schematically in FIG. 2 (for just one of the contact pads 17), these electrical-contact paths 29 extend on the flexible arms 23 and on the elastic suspension element 14 so as to reach the membrane 10 and the possible electronic components.

According to a particular aspect of the present solution, advantageously, the suspension cavities 21 may be obtained (and the supporting elements 20 defined) with the same process steps that, in the embodiment illustrated, lead to formation of the first sensor cavity 11 and of the membrane 10 of the micromechanical sensing structure 4.

In this regard, the process for manufacturing the integrated device 1 is now briefly described.

Figure 3A:
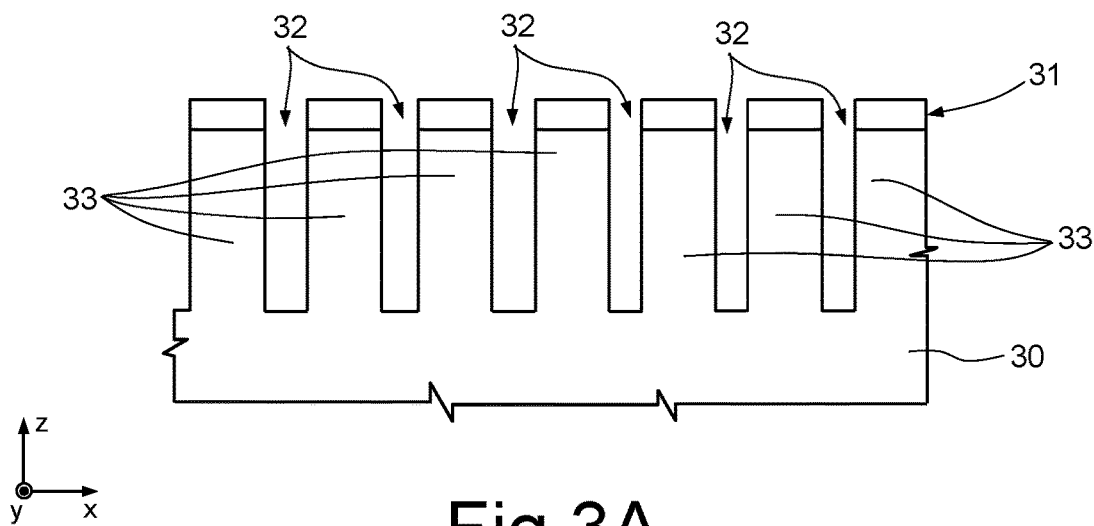
FIGS. 3A-3F are schematic cross-sectional views of the integrated device of FIG. 1, in successive steps of a corresponding manufacturing process.

Initially (FIG. 3A), in a first wafer 30 of semiconductor material, in particular silicon, a buried cavity is formed. For example, for this purpose the manufacturing process described in detail in the European patent EP 1 577 656 (and in the corresponding U.S. Pat. No. 8,173,513) may be used.

It should be noted that within the first wafer 30 a plurality of similar micromechanical structures are obtained (as will be evident to a person skilled in the art), and that, at the end of the manufacturing process, sawing (or dicing) of the first wafer 30 leads to definition of the first die 2 (and of similar bodies of semiconductor material).

In summary, a resist mask 31 having apertures with a lattice arrangement, for example with honeycomb arrangement, is provided on the first wafer 30. Using the mask 31, an anisotropic chemical etch of the first wafer 30 is carried out so as to form a plurality of trenches 32, which communicate with one another and delimit a plurality of silicon columns 33.

Figure 3B:
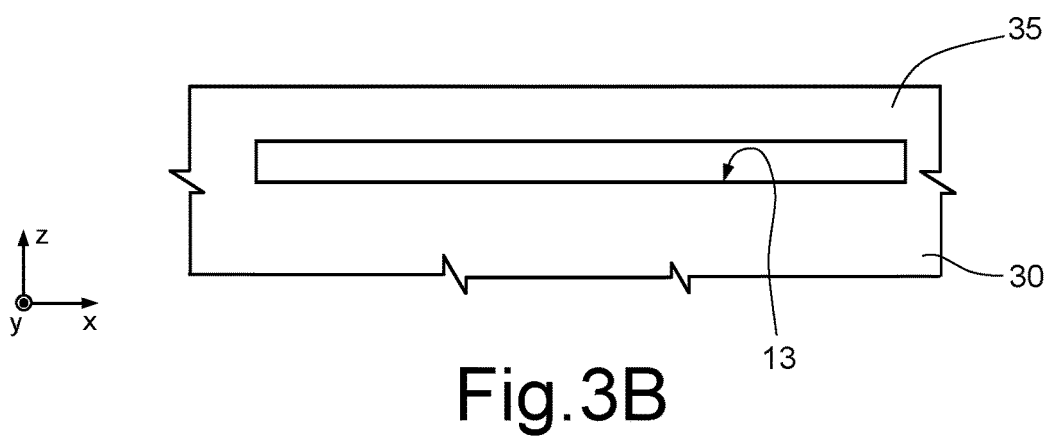

Next (FIG. 3B), the mask 31 is removed, and an epitaxial growth in a reducing environment is carried out. Consequently, an epitaxial layer grows over the columns 33, closing the trenches 32 at the top.

An annealing step is then carried out, for example for 30 minutes at 1190° C., preferably in a hydrogen atmosphere, or, alternatively, in a nitrogen atmosphere. As discussed in the above mentioned patents, the annealing step causes migration of the silicon atoms, which tend to move into positions of lower energy. Consequently, and also thanks to the short distance between the columns 33, the silicon atoms of these columns migrate completely, and a buried cavity is formed, designed to constitute (as will be evident from what follows) the second sensor cavity 13.

Over this second sensor cavity 13 a silicon layer remains, which is constituted in part by silicon atoms grown epitaxially and in part by migrated silicon atoms and forms a closing layer 35.

Figure 3C:
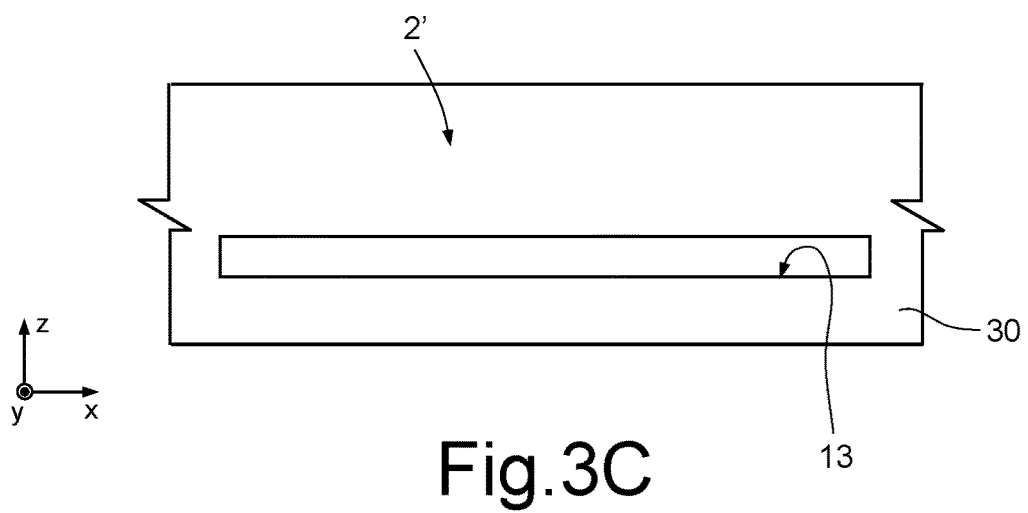

Next (FIG. 3C), a further epitaxial growth is carried out, with a thickness of some tens of microns, for example 50 μm, starting from the closing layer 35. A thick silicon region is thus formed, which overlies the second sensor cavity 13 and is designed to form the active portion 2' of the first die 2.

Figure 3D:
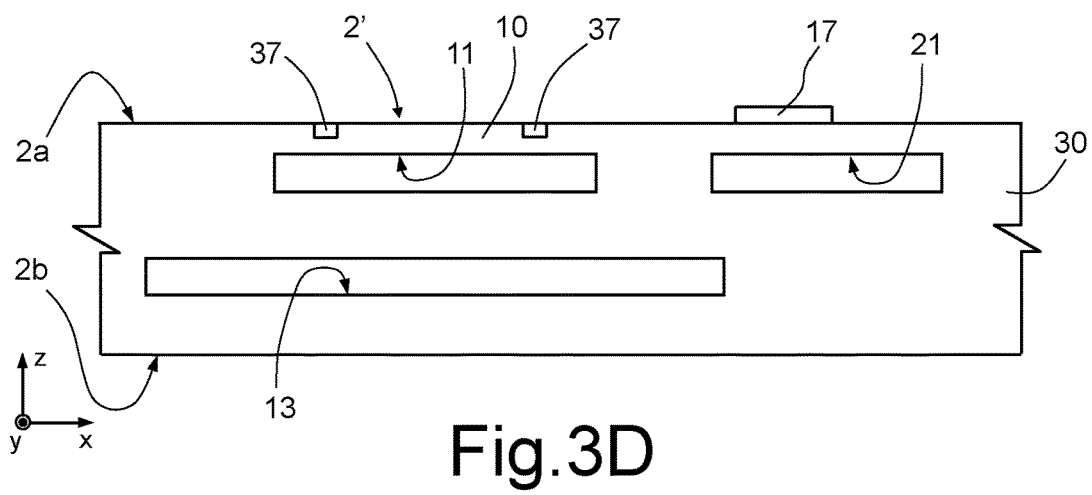

Then (FIG. 3D), in this active portion 2' a further buried cavity is provided, designed to define the first sensor cavity 11, for example by repeating the same manufacturing process as the one disclosed in the aforesaid European patent EP 1 577 656 (described previously with reference to FIGS. 3A and 3B).

The above method further defines the first and second surfaces 2a, 2b of the first wafer 30 (it should be noted that these surfaces are designated by the same references as those of the surfaces of the first die 2, given that, as has been mentioned, the first die 2 is the result of dicing of the first wafer 30).

The membrane 10 is further formed, suspended above the first sensor cavity 11; the membrane 10 is thus delimited at the bottom by the first sensor cavity 11 and faces the first surface 2a. If the application so requires, electronic components 37 may be provided in the membrane 10, for example piezoresistors, via steps of diffusion or implantation of dopant ion species, in a way known and not shown herein. Moreover, in a per se known manner, over the first surface 2a of the first wafer 30 electrical interconnections may be provided, which are not illustrated either.

According to a particular aspect of the present solution, during the process steps that lead to formation of the first sensor cavity 11, the suspension cavities 21 of the supporting elements 20 are also formed, laterally with respect to the membrane 10, once again using the same method described previously.

Next, the contact pads 17 are formed on the first surface 2a, in positions corresponding to the suspension cavities (and to what will then constitute the base 22 of the supporting elements 20), for instance by deposition of material, for example, a metal such as tin, gold, or copper.

Figure 3E:
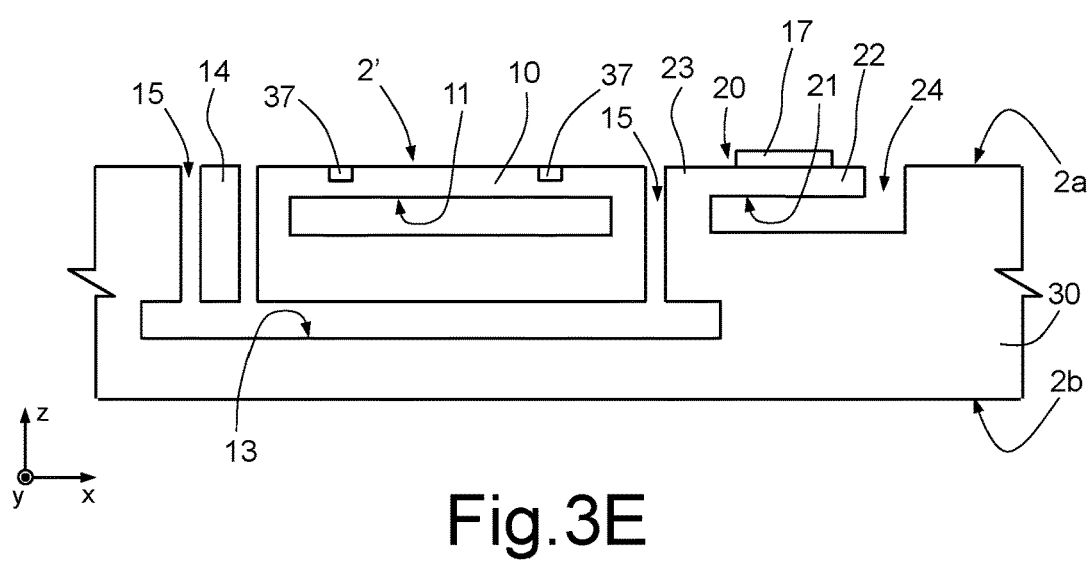

Then (FIG. 3E), using a masking layer, here not shown, a deep etch of the silicon is carried out until the second sensor cavity 13 is reached, thereby forming the trench 15, which is external and surrounds the membrane 10.

Advantageously, in this step of the process, a further etch is carried out, starting from the first surface 2a as far as the suspension cavity 21 of the supporting elements 20, to form the suspension trench 24, which defines the respective base 22 and the respective flexible arm 23.

Figure 3F:
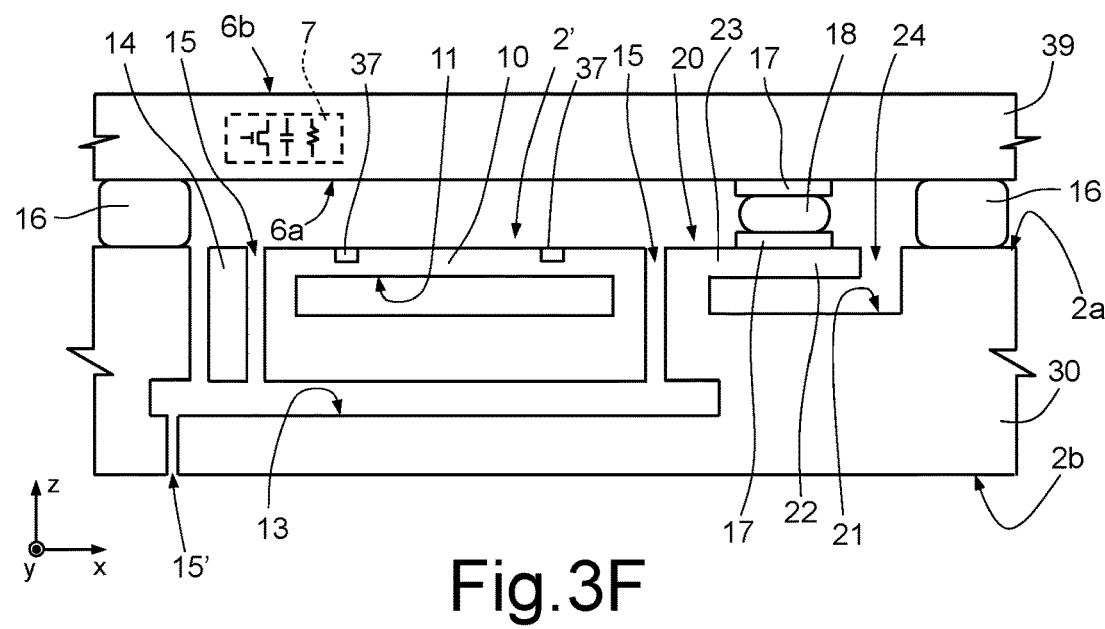

Next (FIG. 3F), the conductive regions 18, made, for example, of solder paste, are formed on the contact pads 17. In addition, the coupling region 16 is formed alongside the active portion 2', made of polymeric material or, as in the example, of a glass-frit material.

In this step (or, possibly, in a previous step of the process) the access channel 15' is also provided, starting from the second surface 2b of the first wafer 30, until the second sensor cavity 13 is reached.

Next, a second wafer 39 of semiconductor material, in particular silicon, is mechanically and electrically coupled to the first wafer 30, for example by applying an appropriate pressure at a high operating temperature.

In the second wafer 39, designed, following upon the dicing operation, for definition of the second die 6 of the integrated device 1, the ASIC 7 has been previously formed at the respective first surface 6a, which is designed for coupling with the first wafer 30. On the same first surface 6a respective contact pads 17 have also been provided, designed for coupling with the contact pads 17 carried by the supporting elements 20.

In particular, the aforesaid coupling operation envisages, in a same step, adhesion of the coupling region 16 to the facing surfaces of the first and second wafers 30, 39, and also adhesion of the conductive regions 18 to the contact pads 17 carried by the first and second wafers 30, 39.

As discussed previously, advantageously, in this step of the process, the elasticity characteristics of the supporting elements 20 enable the mechanical and electrical connections to be obtained in a more accurate and reliable way.

The second wafer 39 thus constitutes a protective cap for the micromechanical sensing structure 4, and the electrical connections between the micromechanical sensing structure 4 and the ASIC 7 are further defined.

It should be noted that the coupling region 16 further constitutes a spacer between the first surface 2a of the first wafer 30 and the first facing surface 6a of the second wafer 39, delimiting an empty space between the facing coupling surfaces (this empty space enables the pressure waves to cause deformation of the membrane 10 of the micromechanical sensing structure 4).

Figure 4:
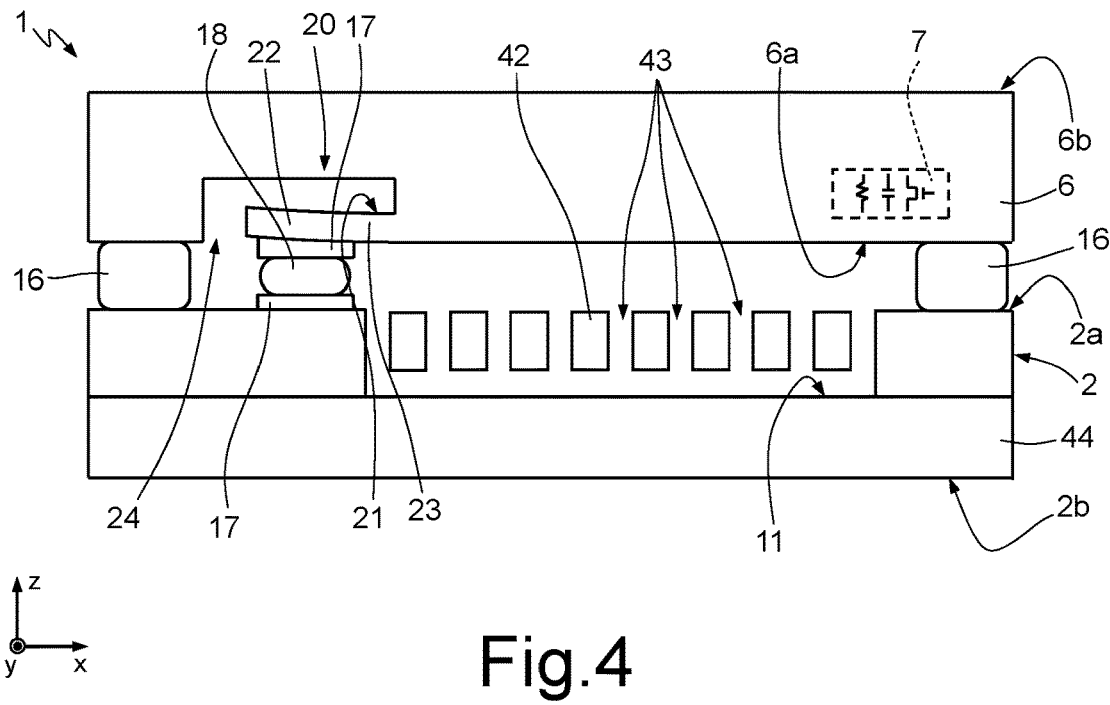
FIG. 4 shows a schematic cross-sectional view of an integrated device with coupled dies, according to a further embodiment of the present solution.

With reference to FIG. 4 a further embodiment of the integrated device is now described, once again designated by 1.

The micromechanical sensing structure 4 provides in this case in the first die 2 an inertial sensor (for example, an accelerometer or a gyroscope), comprising an inertial mass 42, suspended above a first sensor cavity, designated once again by 11.

The inertial mass 42 has a plurality of through holes 43, which are used, during the manufacturing process, for release from an underlying substrate 44, by removal of a sacrificial layer.

In a way not illustrated in detail, the inertial mass 42 is laterally anchored to the substrate 44, and electrical-contact elements coupled to the inertial mass 42, at its anchorages to the substrate 44, are further provided.

The contact pads 17 are present on the top face 2a of the first die 2, laterally with respect to, and at a distance from, the inertial mass 42, and further, externally with respect to the inertial mass 42 and to the contact pads 17, the coupling region 16 is present, which also in this case has a ring conformation, for example a square ring.

In particular, in this embodiment, the supporting elements 20 are provided in the second die 6 (which again integrates the ASIC 7), at the corresponding first surface 6a, instead of being provided in the first die 2.

In particular, the suspension cavity 21 of the supporting elements 20 is in this case provided at the first surface 6a of the second die 6, and the suspension trench 24, which surrounds the base 22 and the respective flexible arm 23, extends from the first surface 6a of the second die 6 as far as the suspension cavity 21.

Figure 5:
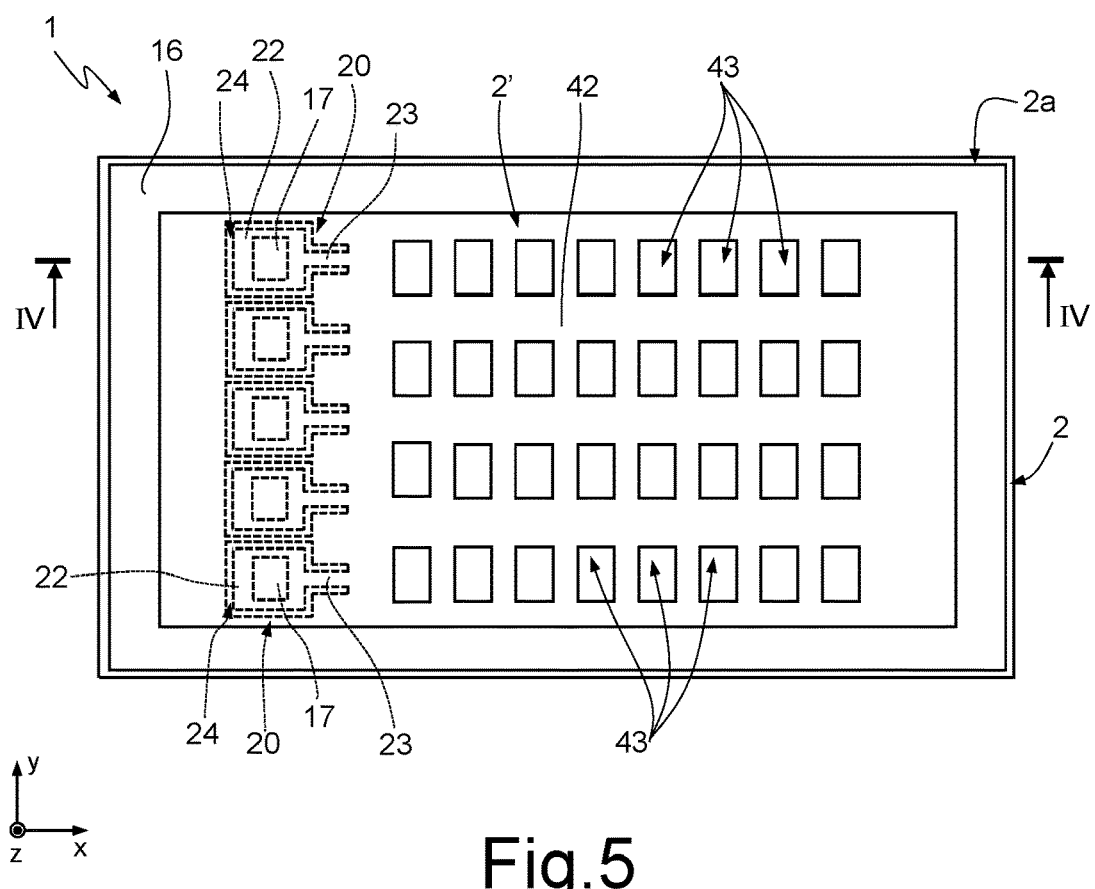
FIG. 5 is a schematic top plan view of the integrated device of FIG. 4.

As shown in the top plan view of FIG. 5, the supporting elements 20 are in this case arranged in a way aligned along the first horizontal axis y of the horizontal plane xy, laterally with respect to the inertial mass 42.

Also in this embodiment, the contact pads 17 carried by the supporting elements 20 are all arranged internally with respect to the coupling region 16, which is arranged to form a ring around the inertial mass 42.

Figure 6A:
FIGS. 6A-6D are schematic cross-sectional views of the integrated device of FIG. 4, in successive steps of a corresponding manufacturing process.

The manufacturing process in this case envisages (FIG. 6A) first provision of the suspension cavity 21 within a surface portion of the second wafer 39 (from dicing of which the second die 6 is obtained), for example with the same steps discussed previously (and as described in detail in the aforesaid patent EP 1 577 656).

Figure 6B:
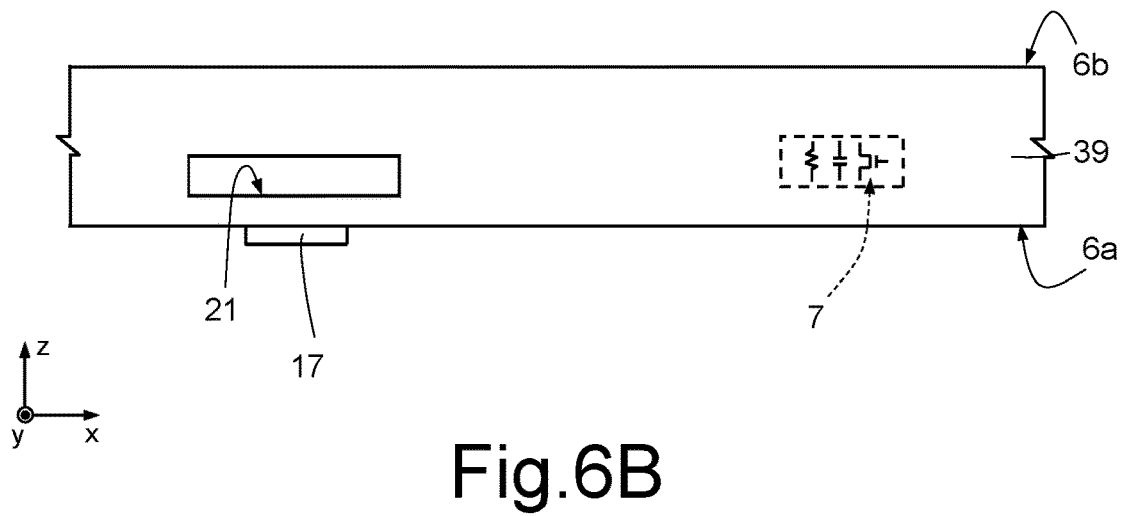

Then (FIG. 6B), appropriate process steps are envisaged (of a per-se known type and not described in detail herein) to form the ASIC 7 at the first surface 6a of the second wafer 39.

The contact pads 17 on the first surface 6a are also formed, arranged vertically corresponding to the suspension cavities 21 (and to what will constitute the base 22 of the supporting elements 20), for instance by deposition of material, for example a metal such as tin, gold, or copper.

Figure 6C:
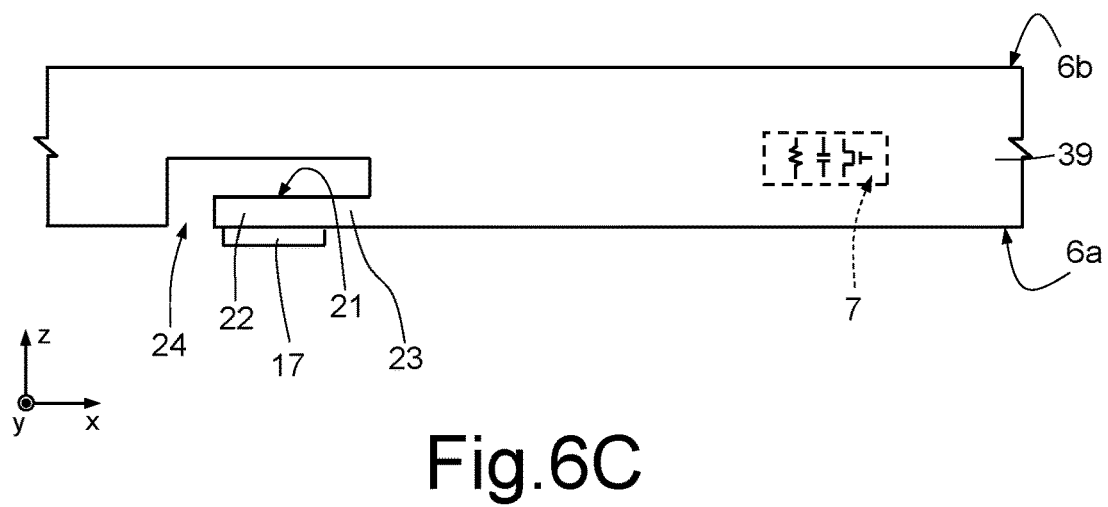

Next (FIG. 6C), an etch is carried out starting from the first surface 6a as far as the suspension cavity 21, to form the suspension trench 24, which defines the base 22 and the flexible arm 23 of the supporting elements 20.

Figure 6D:
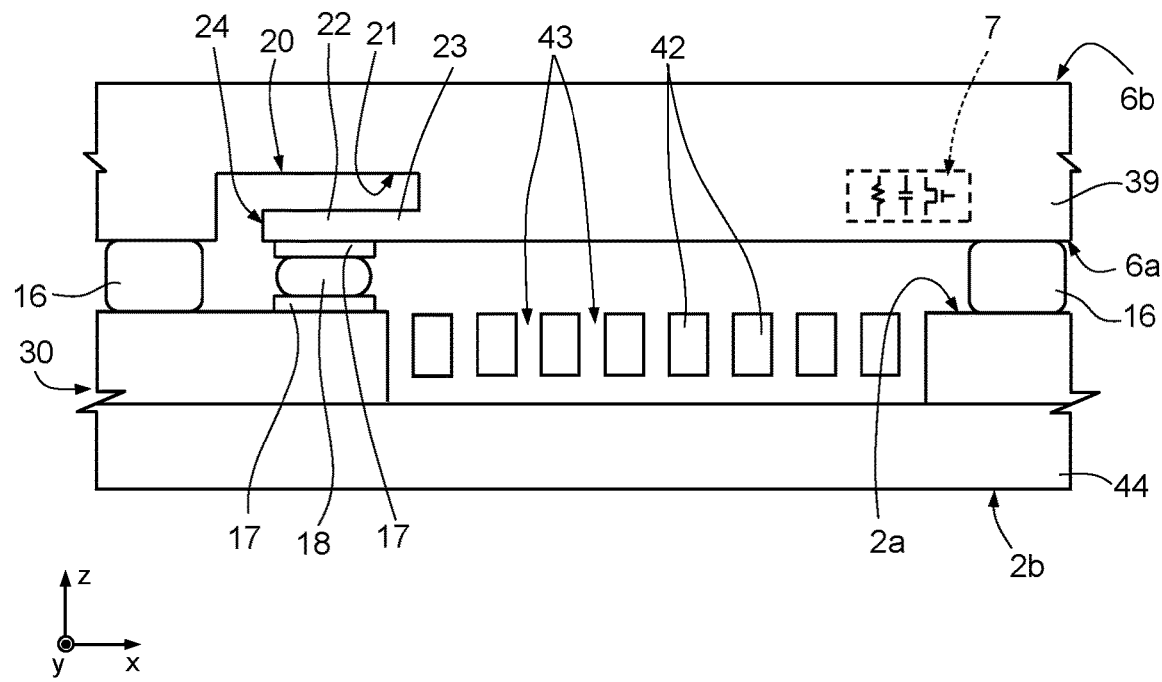

Next (FIG. 6D), the conductive regions 18 are formed on the contact pads 17, made, for example, of solder paste. The coupling region 16, of polymeric material or, as in the example, of a glass-frit material is further formed.

Next, the first wafer 30 (in which the micromechanical sensing structure 4 has been provided, in a per se known manner) is mechanically and electrically coupled to the second wafer 39, as discussed previously (in particular, with the mechanical coupling via the coupling region 16 that is performed substantially at a same time with the electrical coupling by the contact pads 17 and the conductive regions 18). Also in this case, advantageously, the flexibility of the supporting elements 20 enables adaptation to the possible lack of thickness uniformity of the coupling region 16.

In a way not illustrated, the process ends with dicing of the wafers 30, 39, for definition of the first and second dies 2, 6 of the integrated device 1.

The present Applicant has performed several tests and simulations to verify the effectiveness of the described solution.

Figure 7:
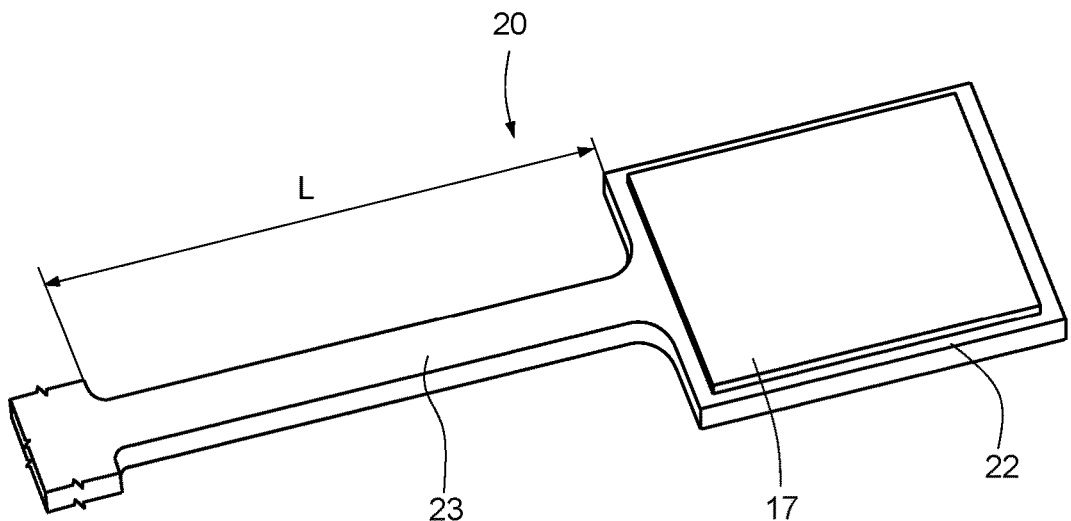
FIG. 7 shows a schematic perspective view of an elastic supporting element in the integrated device according to the present solution.

In particular, FIG. 7 shows a schematic representation of a supporting element 20, where L is the length (main extension in the horizontal plane xy) of the flexible arm 23; in the same FIG. 7 the base 22 and the contact pad 17 provided on the base 22 are further shown.

Figure 8:
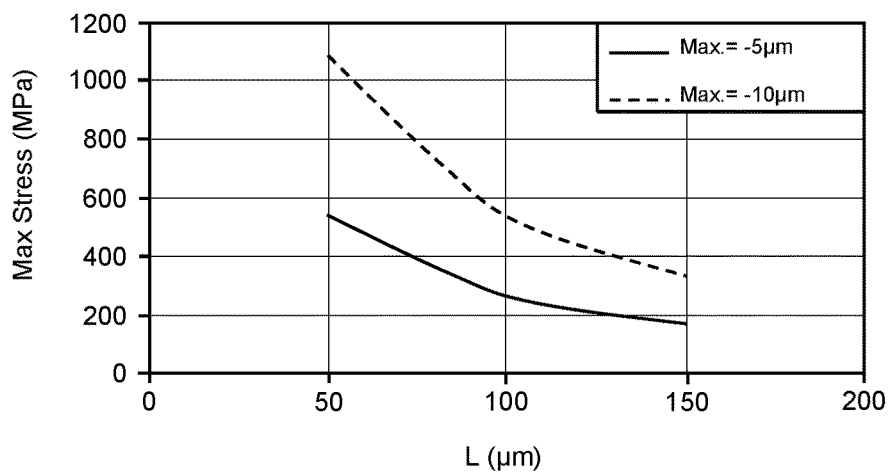
FIG. 8 shows plots representing characteristics of flexibility of the supporting element of FIG. 7.

FIG. 8 shows plots that represent the maximum stress acting on the flexible arm 23 as a function of the length L, on the hypothesis where the deformation applied along the vertical axis z is 5 µm (solid line) or 10 µm (dashed line).

Considering that silicon is generally able to withstand stresses of the order of 4000 MPa, it is evident that the structure proposed is able to operate safely, in all the operating range shown by the aforesaid plots. In particular, in the example illustrated, it may be advantageous to size the flexible arm 23 so that its length L is comprised between 100 and 150 µm.

The advantages of the solution proposed emerge clearly from the foregoing description.

In any case, it is underlined again that the coupling solution that has been described enables in general exploitation of the simplicity and low-cost of the mechanical coupling via a non-conductive coupling region (so-called dummy region), for example of glass frit, at the same time providing an equally advantageous solution for the electrical coupling, via the flexible supporting elements, which carry the electrical contact pads.

In particular, elasticity of these supporting elements advantageously enables compensation of the possible variations of thickness of the mechanical-coupling region, the non-uniformity of thickness of the coupled dies or of layers provided on their surfaces, or any warping or deformation, guaranteeing in each situation a proper electrical contact.

In general, the solution described enables a saving in the occupation of area and a reduction in the manufacturing costs.

Figure 9:
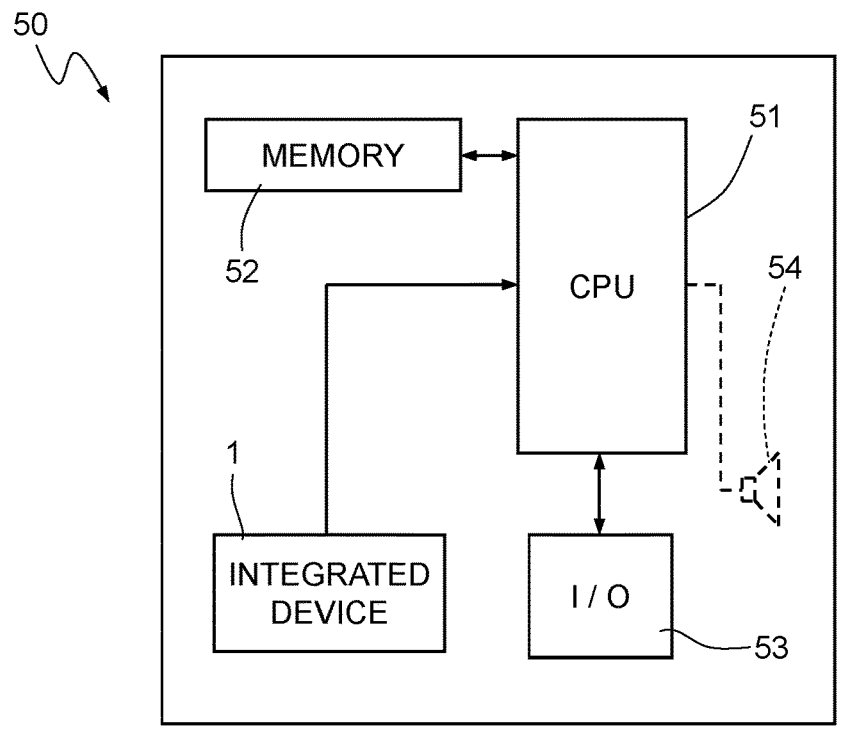
FIG. 9 is a general block diagram of an electronic apparatus incorporating the integrated device according to the present solution.

The integrated device 1 may advantageously be used in an electronic apparatus 50, as illustrated schematically in FIG. 9.

The electronic apparatus 50 comprises, in addition to the integrated device 1, a microprocessor unit 51, a memory block 52, coupled to the microprocessor unit 51, and an input/output interface 53, which is also coupled to the microprocessor unit 51. Moreover, a speaker 54 may be present, for generating a sound on an audio output (not shown) of the electronic apparatus 50.

The electronic apparatus 50 is, for example, a mobile communication device (a smartphone, a tablet, a cellphone, a PDA—Personal Digital Assistant, a notebook, or the like) or a measurement apparatus that may be used in the automotive field or in the industrial field.

Finally, it is clear that modifications and variations may be made to what has been described and illustrated herein, without thereby departing from the scope of the present disclosure.

In particular, a different embodiment may envisage coupling of a first die 2, in which a micromechanical sensing structure is again provided, with a second die 6, of a dummy type, i.e., without circuit elements or functional/structural elements. This second die 6 may have simple functions of routing of the electrical signals coming from the micromechanical sensing structure 4 to the outside of the integrated device 1.

Alternatively, both the first die 2 and the second die 6 may integrate a respective micromechanical structure, of a MEMS type, or else they may both integrate a respective ASIC.

As previously underlined, the coupling region 16 could be made of different materials (other than glass frit), of a non-conductive type.

According to a further embodiment, both the first die 2 and the second die 6 could be provided with respective contact elements, of a flexible type, for ensuring an even greater adaptability to the variations of thickness of the coupling region 16.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated device, comprising:
   a first die;
   a second die coupled in a stacked way to the first die along a vertical axis;
   a mechanical coupling structure arranged between facing surfaces of the first die and of the second die, respectively, which face one another along the vertical axis and lie in respective horizontal planes orthogonal to said vertical axis, the mechanical coupling structure fixedly coupling said first die and said second die and spacing the facing surfaces of the first and second dies from each other;
   electrical-contact elements carried by the facing surfaces of the first die and of the second die, aligned in pairs along the vertical axis;
   conductive regions arranged between the pairs of said electrical-contact elements carried by the facing surfaces of the first die and of the second die, for electrical coupling of said first die and said second die; and
   supporting elements arranged at the facing surface of at least one of the first die and the second die and configured to elastically support the electrical-contact elements, respectively, wherein the electrical-contact elements, conductive regions, and supporting elements are distinct from the mechanical coupling structure.

2. The device according to claim 1, wherein said supporting elements are flexible and are configured to undergo deformation along said vertical axis.

3. The device according to claim 1, wherein each of said supporting elements extends in a cantilever fashion at the facing surface of said at least one of the first die and the second die and defines a respective suspension cavity of a plurality of suspension cavities within said at least one of the first and second dies, each supporting element including:
   a base portion, which defines said suspension cavity and carries the respective electrical-contact element; and
   a flexible arm which elastically connects said base portion to a body portion of said at least one of the first die and the second die.

4. The device according to claim 1, wherein said supporting elements are aligned along a first horizontal axis of said horizontal plane, laterally with respect to, and at a distance from, an active portion of said at least one of the first die and the second die, integrating a micromechanical sensing structure or an electronic circuit.

5. The device according to claim 1, wherein said mechanical coupling structure is made of a non-conductive material.

6. The device according to claim 5, wherein said mechanical coupling structure is made of glass frit.

7. The device according to claim 1, wherein said coupling structure has a ring conformation, and said supporting elements are arranged inside said coupling region in said horizontal plane.

8. The device according to claim 1, further comprising:
a micromechanical sensing structure integrated in said first die and including first sensor cavity; and
an electronic circuit electrically integrated in said second die and coupled to said micromechanical sensing structure by said electrical-contact elements and said conductive regions.

9. The device according to claim 8, wherein said micromechanical sensing structure comprises a membrane suspended above said first sensor cavity, and wherein said supporting elements are arranged at the facing surface of said first die, laterally with respect to, and at a distance from, said membrane in said horizontal plane.

10. The device according to claim 9, wherein said micromechanical sensing structure further comprises a second sensor cavity, and wherein said membrane and said first sensor cavity are integrated in an active portion of said first die, and are suspended above said second sensor cavity, the device further comprising:
elastic suspension elements elastically coupling the active portion to a body portion of the first die; and
a suspension trench that extends from said first surface to said second buried cavity and surrounds the active portion.

11. The device according to claim 8, wherein said electronic circuit is integrated in a surface portion of said second die, and wherein said supporting elements are arranged at the facing surface of said second die, laterally with respect to, and at a distance from, said surface portion in said horizontal plane.

12. An electronic apparatus, comprising a microprocessor unit; and
an integrated device that includes:
a first die;
a second die coupled in a stacked way to the first die along a vertical axis;
a mechanical coupling structure arranged between facing surfaces of the first die and of the second die, respectively, which face one another along the vertical axis and lie in respective horizontal planes orthogonal to said vertical axis, the mechanical coupling structure fixedly coupling said first die and said second die and spacing the facing surfaces of the first and second dies from each other;
electrical-contact elements carried by the facing surfaces of the first die and of the second die, aligned in pairs along the vertical axis;
conductive regions arranged between the pairs of said electrical-contact elements carried by the facing surfaces of the first die and of the second die, for electrical coupling of said first die and said second die; and
supporting elements arranged at the facing surface of at least one of the first die and the second die and configured to elastically support the electrical-contact elements, respectively, wherein the electrical-contact elements, conductive regions, and supporting elements are distinct from the mechanical coupling structure.

13. The electronic apparatus according to claim 12, wherein each of said supporting elements extends in a cantilever fashion at the facing surface of said at least one of the first die and the second die and defines a respective suspension cavity of a plurality of suspension cavities within said at least one of the first and second dies, each supporting element including:
a base portion, which defines said suspension cavity and carries the respective electrical-contact element; and
a flexible arm which elastically connects said base portion to a body portion of said at least one of the first die and the second die.

14. A process for manufacturing an integrated device comprising:
mechanically coupling a first wafer to a second wafer in a stacked way along a vertical axis, by a mechanical coupling structure arranged between facing surfaces of the first wafer and of the second wafer, which face one another along the vertical axis and lie in respective horizontal planes orthogonal to said vertical axis, the mechanical coupling structure fixedly coupling said first die and said second die and spacing the facing surfaces of the first and second dies from each other;
electrically coupling said second wafer to the first wafer by electrical-contact elements carried by the facing surfaces of the first wafer and of the second wafer, aligned in pairs along the vertical axis, and conductive regions arranged between the pairs of said electrical-contact elements; and
providing supporting elements, arranged at the facing surface of at least one of the first wafer and the second wafer and configured to elastically support the electrical-contact elements, respectively, wherein the electrical-contact elements, conductive regions, and supporting elements are distinct from the mechanical coupling structure.

15. The process according to claim 14, wherein the mechanical-coupling and the electrical-coupling comprise a common step of thermocompression coupling of said first wafer and said second wafer.

16. The process according to claim 15, wherein said mechanical coupling structure is made of a non-conductive material.

17. The process according to claim 14, wherein providing each of said supporting elements comprises:
forming a suspension cavity buried in said at least one of the first wafer and the second wafer near the facing surface; and
providing a suspension trench starting from said facing surface as far as said suspension cavity, to define a base portion of said supporting element, suspended above said suspension cavity, and a flexible arm, which elastically connects said base portion to a body portion of said at least one between the first wafer and the second wafer; and wherein the electrical-coupling comprises forming respective electrical-contact elements on the base portions of said supporting elements.

18. The process according to claim 17, further comprising providing a micromechanical sensing structure in the first wafer, wherein providing said micromechanical sensing structure comprises forming a first sensor cavity buried in said first wafer, separated from said facing surface by a membrane; and wherein forming said suspension cavity is carried out in a same process together with forming said first sensor cavity.

19. The process according to claim 18, wherein providing said supporting elements comprises forming said supporting elements laterally with respect to, and at a distance from, said membrane, within said mechanical coupling structure.

20. The process according to claim 17, further comprising forming an electronic circuit in a surface portion of said second wafer, wherein forming said suspension cavity comprises forming said suspension cavity buried in said second wafer at the facing surface, laterally with respect to, and at a distance from, said surface portion.

21. An integrated device, comprising:
   a first die;
   a second die coupled in a stacked way to the first die along a vertical axis;
   a pair of electrical-contact elements carried by the facing surfaces of the first die and of the second die, the electrical-contact elements being aligned along the vertical axis;
   a conductive region arranged between the electrical-contact elements, for electrical coupling of said first die and said second die;
   a supporting element arranged at the facing surface of the first die and configured to elastically support the electrical-contact elements; and
   a mechanical coupling structure arranged between facing surfaces of the first die and of the second die, respectively, the mechanical coupling structure fixedly coupling said first die and said second die and spacing the facing surfaces of the first and second dies from each other, wherein the electrical-contact elements, conductive region, and supporting element are distinct from the mechanical coupling structure.

22. The device according to claim 21, wherein the supporting element extends in a cantilever fashion at the facing surface of the first die and defines a suspension cavity within the first die, the supporting element including:
   a base portion, which defines said suspension cavity and carries one of the electrical-contact element; and
   a flexible arm which elastically connects the base portion to a body portion of the first die.

* * * * *